United States Patent
Cho

(10) Patent No.: US 6,204,115 B1
(45) Date of Patent: Mar. 20, 2001

(54) MANUFACTURE OF HIGH-DENSITY PILLAR MEMORY CELL ARRANGEMENT

(75) Inventor: Hyun-Jin Cho, Stanford, CA (US)

(73) Assignee: Stanford University, Palo Alto, CA (US)

( * ) Notice: Subject to any disclaimer, the term of this patent is extended or adjusted under 35 U.S.C. 154(b) by 0 days.

(21) Appl. No.: 09/325,580

(22) Filed: Jun. 3, 1999

(51) Int. Cl.⁷ .................................................. H01L 21/8242
(52) U.S. Cl. ........................ 438/253; 438/241; 438/243; 438/244; 438/386; 438/387; 438/396; 438/268; 438/270
(58) Field of Search ........................ 438/243, 244, 438/253, 386, 387, 396, 268, 270, 241

(56) References Cited

U.S. PATENT DOCUMENTS

| | | |
|---|---|---|
| 4,977,102 * | 12/1990 | Gambino et al. ........... 438/269 |
| 5,102,817 | 4/1992 | Chatterjee et al. . |
| 5,192,704 * | 3/1993 | McDavid et al. ........... 438/396 |
| 5,252,845 | 10/1993 | Kim et al. . |
| 5,316,962 * | 5/1994 | Matsuo et al. ........... 438/396 |
| 6,020,239 * | 2/2000 | Gambino et al. ........... 438/269 |

OTHER PUBLICATIONS

Wolf et al., "Chemical Vapor Deposition of Amorphous and Polycrystalline Films, Silicon Processing for the VLSI Era vol. 1–Process Technology," pp179, 1986.*

Hyun–Jin Cho, Peter Griffin, and James Plummer, "Poly-silicon Pillar Mosfet's for a High Density Trench Dram Cell," Schematic drawing of a new DRAM cell using polysilicon pillar transistor.

* cited by examiner

Primary Examiner—John F. Niebling
Assistant Examiner—Jennifer M. Kennedy
(74) Attorney, Agent, or Firm—Crawford PLLC

(57) ABSTRACT

A fabrication process benefits high-density DRAM cells, including four-Gbit cells and beyond. In one embodiment, a poly-Si pillar transistor is formed on top of a trench capacitor with the top of the pillar transistor being directly connected to the bit line. To reduce the process steps, word line formation is achieved by a spacer etch process and a self-aligned process is used for formation of bit line contact using a CMP process. This embodiment reduces necessary layout area and provides improvements in overall device performance.

23 Claims, 3 Drawing Sheets

$4F \times 2F = 8F^2$ $2F \times 2F = 4F^2$

MANUFACTURE OF HIGH-DENSITY PILLAR MEMORY CELL ARRANGEMENT

BACKGROUND STATEMENTS

The inventive aspects disclosed herein were made with Government support under contract DABT-63-94-C-0055. The Government has certain rights in these inventive aspects.

FIELD OF THE INVENTION

The present invention relates generally to semiconductor memory circuits and their manufacture and, more particularly, to memory structures and fabrication providing benefits relating to reductions in terms of both circuit-implementation area and processing.

BACKGROUND OF THE INVENTION

The electronics industry continues to strive for high-powered, high-functioning circuits. Significant achievements in this regard have been realized through the fabrication of very large-scale integration of circuits on small areas of a silicon wafer. Integrated circuits of this type are manufactured through a series of steps carried out in a particular order. Main objectives in manufacturing many such devices include obtaining a device that occupies as small an area as possible and consuming low levels of power using low supply levels, while performing at speeds comparable to speeds realized by much larger devices.

Marketplace needs have created a demand for increased fast data-storage capability in an ever-decreasing package size. For many applications, this has translated to efforts to increase the number of memory cells in a given chip size (or real estate area) but using fewer elements to implement each of the cells. The tension between attempting to increase the number of memory cells while using a smaller package, has resulted in a variety of efforts and approaches to memory cell design.

One type of fast data-storage device that has been consistently used to address such demands is high density DRAM, which is approaching an era of giga-bit scale. Technology has been developed leading to the advent of 4 Gbit DRAM which requires the minimum cell area of 0.1 $\mu m^2$. This degree of scaling has been enabled by advances in photolithography and memory cell technology such as complicated capacitor structures and dielectric materials. However, as the cell area decreases, process margins such as alignment tolerance have become limiting factors for developing next generation DRAM cells. In addition, the leakage current through transistors and isolations between adjacent cells increases significantly degrading refresh characteristics of devices. These problems expand with decreases in the cell area without changing basic cell layouts such as the conventional 1 M DRAM structure dating back to the late 1980's.

FIG. 1A illustrates such a conventional layout. The layout of FIG. 1A consists of 8 $F^2$ size boundary, where F is the minimum feature size. A structure including conventional MOSFET and a stack or trench capacitor, is placed laterally in this layout.

There have been efforts to decrease the number of features, and several reports have proposed fabricating DRAM cells with significantly different layouts. One such approach proposes building DRAM cells with a 4 $F^2$ layout. This type of structure is shown in FIG. 1B. The key benefit of this technology lies in the basic layout. Given a minimum feature size (F), the cell area is 4 $F^2$ rather than 8 $F^2$ for the conventional structure. Accordingly, the cell area can be reduced by one half using this type of layout.

Further, within this cell area of size-reduced layouts, large process margins can be achieved using a vertically-arranged pass transistor. Since the pass transistor is formed vertically, the channel length does not change as the cell size decreases. This long channel permits the transistor device to have low-level subthreshold currents and small drain-induced-barrier-lowering (DIBL) effects. Also, because the pass transistors in each pair of adjacent cells are not formed along an electrically intercoupled path, isolation between the pass transistors is inherent.

While the architectures of such structures show promise, the processing steps used to implement the architectures have been overly-complex. These processing proposals typically involve the introduction of complex processing steps into a less-burdensome conventional process, for the purpose of manufacturing a DRAM memory cell including a pillar-type pass transistor over a capacitor. Examples of these architectures and their proposed processing approaches are characterized in: U.S. Pat. Nos. 5,252,845 ("Trench DRAM Cell With Vertical Transistor") 5,316,962 ("Method Of Producing A Semiconductor Device Having Trench Capacitors and Vertical Switching Transistors"), and 5,102,817 ("Vertical DRAM Cell And Method"); and various papers including S. Maedada et al., VLSI Tech. Symp., p.133 (1994), and K. Sinouchi et al., IEDM Techical Digest, p.23 (1989). Some of the process problems presented by these approaches include: the epi process from the contact hole being barely controllable; the gate oxide grown from the gate (rather than the channel) causing a potential reliability problem; alignment tolerances between contact holes; and word lines that are patterned before the contact process. Even though each of the above approaches uses vertical pillar structure that permits construction of the word line via the self-alignment, these approaches have the tendency of decreasing process margins more than conventional processes.

Accordingly, there is a need for a semiconductor manufacturing process for constructing a memory cell that reduces the complexity typically associated with vertically-arranged transistors in DRAM cells, maintains process margins of conventional processes, and overcomes problems associated with the above-mentioned prior art.

SUMMARY OF THE INVENTION

One important aspect of the present invention is directed to a process of manufacturing a DRAM cell structure using a poly-silicon pillar transistor for 4-Gbit applications and beyond. One such DRAM cell structure, manufactured in accordance with the present invention, is implemented using a layout contained in a 4 $F^2$ area.

A specific example embodiment of a process in accordance with the present invention involves the formation of a DRAM cell arrangement including a pillar transistor and a capacitive structure over or under the pillar transistor (depending upon the implementation). This particular process includes forming a non-conductive layer, such as SiN layer, over a semiconductor material, which forms the pillar transistor structure such that it includes the semiconductor material and the overlying non-conductive layer. To save process steps, the pillar photolithography and anisotropic etching processes can be performed directly over the capacitive structure in a self-aligned manner. Next, a conductive layer is formed around the pillar structure to form a pillar transistor that includes the conductive layer and the pillar structure. A dielectric material is formed over the pillar transistor and is then removed, via CMP, until the non-conductive layer is exposed to open the contacts. The non-conductive layer is then removed and a conductive layer on the pillar structure is formed.

In one application in which the capacitive structure is beneath the pillar transistor, the conductive layer formed on the pillar structure is used as the bit line, the conductive layer formed around the pillar structure is used as the word line, and multiple implants are used to provide uniform channel doping in the semiconductor material of the pillar structure.

Using various aspects of the present invention, significant improvements in high-performance electrical characteristics and fewer defects in the pillar transistor have been realized. Other aspects and embodiments of the present invention will be apparent upon review of the discussion in connection with the drawings.

BRIEF DESCRIPTION OF THE DRAWINGS

The invention may be more completely understood in consideration of the detailed description of various embodiments of the invention which follows in connection with the accompanying drawings, in which.

Figure 1A:
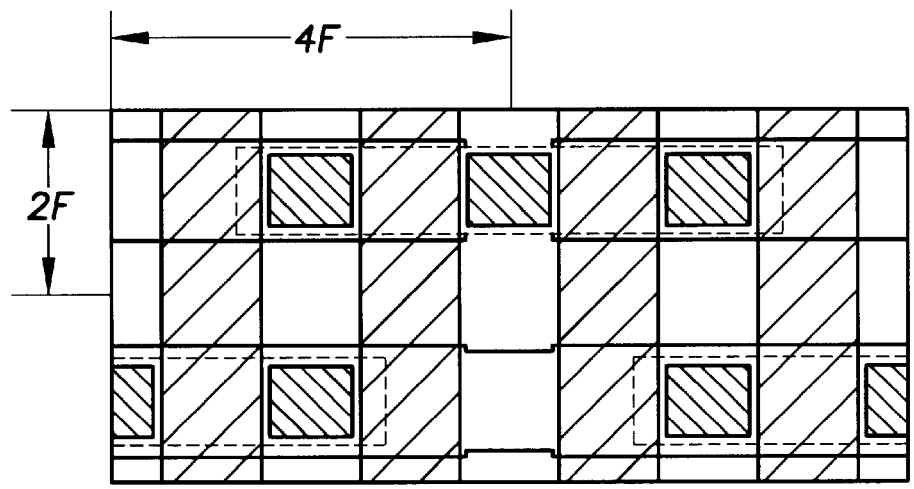
FIG. 1A shows a conventional DRAM cell layout.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems and arrangements that benefit from large-scale data storage. The invention has been found to be particularly advantageous in DRAM circuit applications where there is a need to store large amounts of data in a compact area Examples of such applications include, but are not necessarily limited to, stand-alone and embedded DRAM circuits. An appreciation of various aspects of the invention is best gained through a discussion of application examples operating in such an environment.

A specific example embodiment of a process in accordance with the present invention involves the formation of a DRAM cell arrangement. For each cell in an array accessed by word lines and bit lines, the process includes forming a capacitor and a poly-Si pillar transistor so that it connects directly above the capacitor. The capacitor is used as a storage cell with one electrode connected to the pillar transistor's source/drain region for maintaining a charge. The pillar transistor has its gate formed as a conductive layer around an erected channel that is also part of the pillar structure. The pillar transistor's gate is implemented as part of the cell's word line. The drain/source region of the pillar transistor, which is part of the cell's bit line, is formed as a self-aligned conductive layer over the top of the pillar structure. To minimize the number of processing steps, this particular example embodiment can be completed using only three photolithography steps, respectively for the trench, the pillar and the bit line.

An example process according to the present invention that can be used to manufacture a DRAM cell arrangement, such as the one characterized above, includes several operations. These operations include: forming a capacitive structure over a semiconductor material and a semiconductor material over the capacitive structure, and forming a non-conductive layer, such as SiN layer, over the semiconductor material. The non-conductive layer is part of a pillar structure formation in which the semiconductor material and the overlying non-conductive layer are stacked. Next, a conductive layer is formed around the pillar structure to form a pillar transistor that includes the conductive layer and the pillar structure. A dielectric material is formed over the pillar transistor and is then removed, via chemical-mechanical polishing (CMP), until the non-conductive layer is exposed to open the contacts. The non-conductive layer is then removed, and a conductive layer on the pillar structure is formed.

Figure 1B:
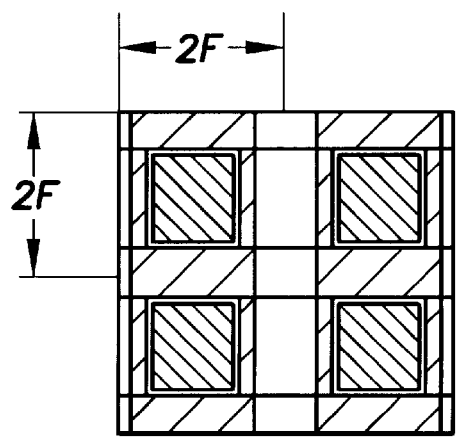
FIG. 1B shows a pillar DRAM cell with a cell layout consistent with an embodiment of the present invention.

FIG. 1B illustrates an example layout of the pillar DRAM cell, manufactured as described above in connection with this example embodiment of the present invention. Since the word line is formed by a spacer etch process in this example, there is no word line illustrated in the layout of FIG. 1B.

Figure 2A:
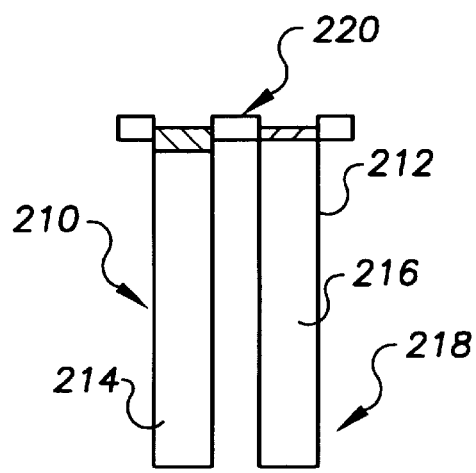
FIGS. 2A–2D show an example process sequence of a pillar DRAM cell consistent with an embodiment of the present invention.

An example process flow for fabricating a pillar DRAM cell, such as one having the layout of FIG. 1B, can be appreciated with reference to the various stages of the fabrication of the structure in FIGS. 2A–2D. FIG. 2A depicts conventional formation of trench capacitors 210 and 212. Each of the trench capacitors 210 and 212 includes an doped poly-Silicon plug 214 or 216 that, in one example embodiment, acts as the storage node for holding the charge of the memory cell. The illustrated embodiment involves the formation of an n-type pass transistor; thus the plug 214 or 216 (connecting to the source of the transistor) is doped n+. In alternative embodiments, the above trench capacitor is replaced with stacked and planar capacitors used to provide a storage node with adequate capacity (typically high-capacity (Hi-C)) for the memory cells. Transistor configurations other than the type and structure of the above pass transistor can also be used.

In the illustrated embodiment, each of the trench capacitors 210 and 212 further includes an outer capacitor dielectric layer 218 and an outer electrode layer (not shown). An insulative layer 220, e.g., an oxide layer formed using a chemical-vapor deposition (CVD) process, is then formed. The skilled artisan will appreciate that the insulative layer 220 can be formed before or after formation of the trench capacitors 210 and 212.

Figure 2B:
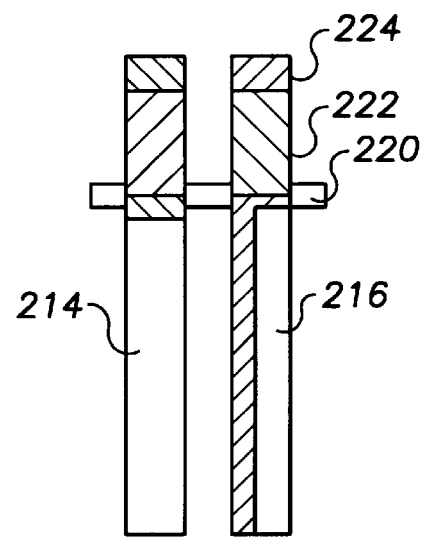

As depicted in FIG. 2B, after filling the trenches with the n+ doped poly-silicon, a layer of silicon is formed over the top of the trench capacitors 210 and 212. In one embodiment, about 1 $\mu$m of amorphous silicon ("α-Si") is deposited to form α-Si layer 222. Although use of amorphous silicon is not required, it is advantageous because it avoids formation of a channeling tail as is known in the art. Multiple energy boron implants into the α-Si layer are used to obtain uniform channel dopings. Silicon nitride (e.g., $Si_3N_4$) is then deposited over the α-Si layer to form the silicon-nitride layer 224. The pillar photolithography and etching processes are performed directly above the trench plugs. Crystallization annealing is then performed, e.g., at 800° C. for 24 hours.

Figure 2C:
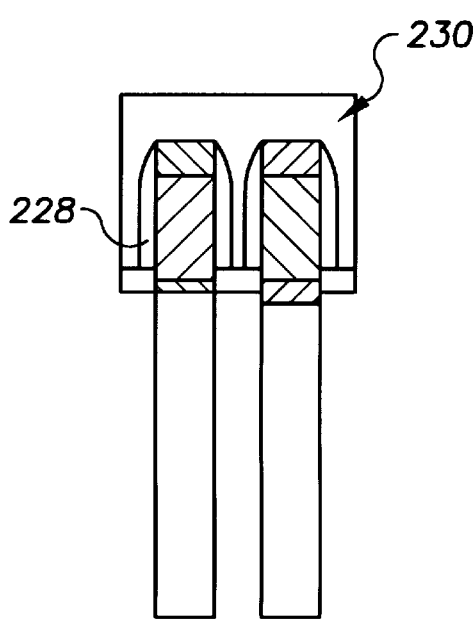
Figure 2D:
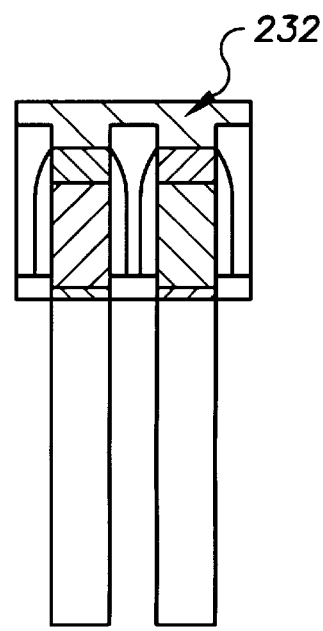

As shown in FIG. 2C, gate oxidation is performed followed by gate poly deposition. A gate poly layer is deposited to create to a structure from which a self-aligned word line 228 can be formed. In one example embodiment, the self-aligned word line 228 is created by anisotropic spacer etching of the gate poly, and the space between the pillars (including the layers 222 and 224) along the word line direction is greater than the bit line direction so that the gate 228 can surround the channel 222 and be connected only in the word line direction. N-type dopants are implanted over the gate poly spacer for control of the offset (LDD) structure in the transistor devices.

Next, a self-aligned contact is formed on top of each of the pillars. After deposition of a doped oxide 230, such as BPSG (borophosphosilicate glass), the structure is chemically-mechanically polished (CMP). This CMP process is advantageous in terms of both providing planarization and opening a self-aligned contact. During the CMP operation, the previously-deposited silicon-nitride layer 224 on top of the pillar is used as an etch stop layer for the CMP process. Opening of the contacts is completed by wet etching of the silicon-nitride layer 224. With the contacts to the transistor opened, conventional photolithography processes are used to form the bit line 232.

In another more specific example embodiment, an n-type <100> substrate is annealed at 900° C. for 1 hour in a $POCL_3$ (phosphorus oxychloride) environment. Amorphous silicon is deposited by PECVD with $SiH_4$ and Ar as a carrier gas at 580° C. for 6 hours resulting in a thickness of 1 $\mu$m. Triple boron implantations (e.g., 90 keV/180 keV/320 keV) are then performed to form a uniform doping profile in the channel. Pillar photolithography is conducted using an E-beam direct writing machine with the pillar diameter ranging from 0.15 $\mu$m to 5 $\mu$m. A RIE etch machine (such as a LAM) is used to etch the pillars all the way down to the substrate. Crystallization annealing is then performed at 600° C. for 24 hours in an $N_2$ furnace followed by sacrificial oxidation at 800° C. for 15 minutes in wet $O_2$. After the wet etching of the oxide, gate oxidation is conducted at 600° C. in wet $O_2$ for time ranging from 10 to 15 minutes; thereby forming a thickness of oxide from 12 nm to 18 nm respectively. The pillar width and gate oxide thickness at the side wall of the pillar can be measured by a cross-sectional TEM. After deposition of an in situ n+ doped poly layer over pillars, the gate pattern is produced by a spacer etching technique using the same recipe of pillar etching. As+ implantation is then conducted to form the source/drain regions with the dose of 1E15 and energy of 35 keV. Activation annealing is performed at 900° C. for 2 minutes by rapid thermal annealing (RTA). After the metallization process, an ECR plasma etcher is used to perform hydrogenation. The gas flow for hydrogenation is 1 sccm at 450° C. for 30 minutes. Device parameters can be measured using a HP4155DC parameter analyzer. Using an automatic DC measurement machine, such as a HP4062, the uniformity of device characteristics can be checked.

Figure 3:
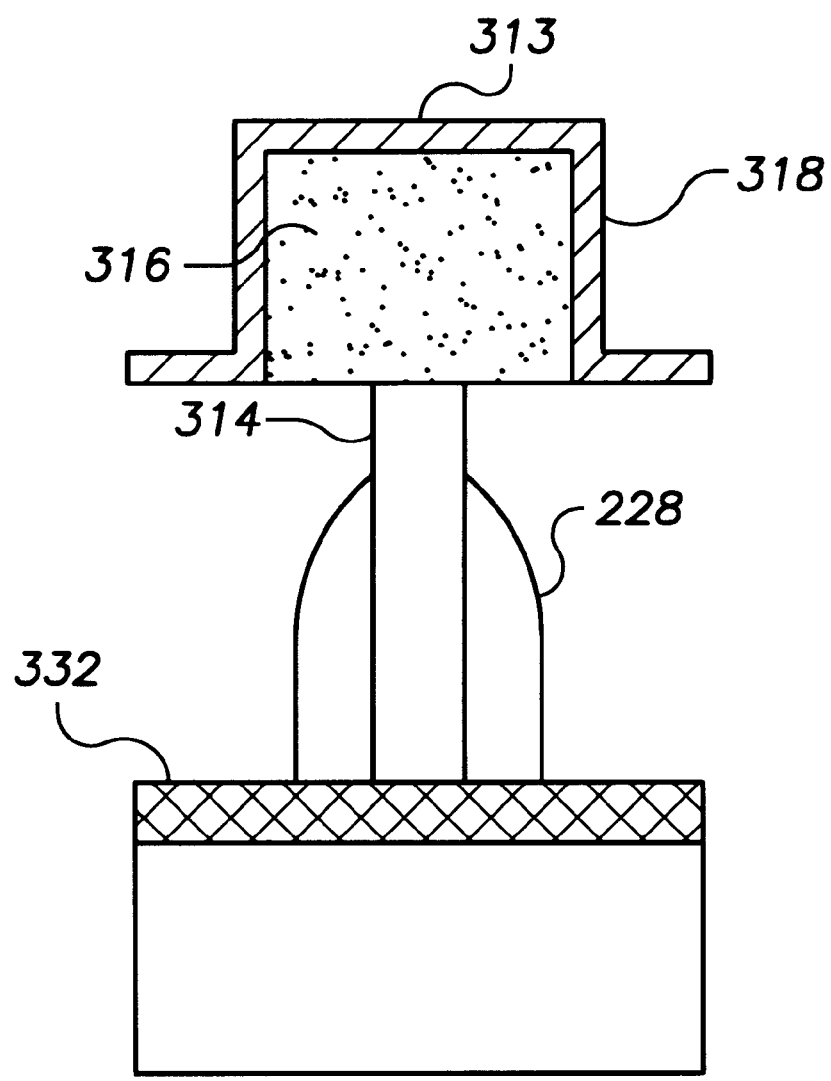
FIG. 3 shows the optional stack capacitor DRAM cell manufactured consistent with an alternate embodiment of the present invention.

While the above structure has been characterized for a DRAM cell having a poly-silicon pillar transistor in connection with the trench capacitor, as mentioned above, the cell construction is not limited to trench capacitors. FIG. 3 illustrates the fabrication of a stacked DRAM cell with the poly-Si pillar transistor structure of FIGS. 2A–2D and with a stacked capacitor. Similar reference numeral assignments are used to show the correlation between the various items depicted in the example structure of FIGS. 2A–2D and in the example structure of FIG. 3.

In FIG. 3, bit-line 332 is formed by poly-Si or tungsten (W) by the Damascene process which simultaneously forms a planar surface. Fabrication procedures of the cell transistor and self-aligned contact, capacitor to transistor, are the same as the process described above in connection with FIGS. 2A–2D. The stacked capacitor in FIG. 3 is shown to include a storage n+ poly 318 covered by a capacitor dielectric 318, in turn, covered by a plate poly 313.

Various kinds of stack cells can be integrated with this structure. FIG. 3 shows the stack capacitor with high-k dielectric material as an optional structure. Since the contact between the capacitor and transistor is formed using a self-aligned process, process margin improves significantly.

For background information and details regarding alternative devices for implementing various parts of the above-illustrated cells and regarding conventional processes used to implement operations associated with the above-discussed implementations of the present invention, reference may be made to the documents identified herein in the background section and to "Silicon Processing for the VLSI Era, Vol. 2: Process Integration," Stanley Wolf, Lattice Press, Sunset Beach, Calif., 1990.

Accordingly, various example implementations of the present invention are advantageous in that they do not overly-burden the semiconductor manufacturing process for construction of pillar-based transistors in memory cells, and they yield high process flexibility and cost reduction for the fabrication of high-density DRAM cell arrays. Further, these implementations maintain conventional process margins and overcome problems associated with the above-mentioned prior art. These example implementations described above, and their associated advantages, are provided by way of illustration only and are not intended to limit the invention. Those skilled in the art will readily recognize that various modifications and changes can be made to the present invention, including but not limited to the alternative embodiments and associated advantages mentioned above. Rather than limiting the scope of the present invention, the example implementations are used for illustrative purposes in support of the following claims which set forth the scope of the present invention.

What is claimed is:

1. A process of fabricating a memory cell including a capacitive structure, comprising:
    forming a pillar transistor over a semiconductor material with the pillar transistor including an amorphous silicon material, a non-conductive layer over the amorphous silicon material, and a first conductive layer around the pillar structure;
    forming a dielectric material over the pillar transistor;
    removing the dielectric material until the non-conductive layer is exposed;
    removing the non-conductive layer; and
    forming another conductive layer on pillar structure, wherein the capacitive structure is formed vertically in line with the pillar transistor and the underlying semiconductor material.

2. A process of fabricating a memory cell, according to claim 1, wherein forming a pillar transistor over the semiconductor material includes forming a uniformly-doped channel section.

3. A process of fabricating a memory cell, according to claim 1, wherein forming a pillar transistor over the semiconductor material includes forming a channel section in the semiconductor material using amorphous silicon and further including conducting a recrystallization annealing of the pillar structure.

4. A process of fabricating a memory cell, according to claim 1, wherein forming a pillar transistor over the semiconductor material includes forming a uniformly-doped channel section using the amorphous silicon as the semiconductor material and further including conducting a recrystallization annealing of the pillar structure.

5. A process of fabricating a memory cell, according to claim 1, wherein the capacitive structure is formed under the pillar transistor, and further including forming the other conductive layer on pillar structure as part of a bit line for the memory cell, and forming the first conductive layer around the pillar structure as part of a word line for the memory cell.

6. A process of fabricating a memory cell, according to claim 5, wherein forming a pillar transistor over the semiconductor material includes forming a uniformly-doped channel section using amorphous silicon as the semiconductor material, forming the non-conductive layer includes forming the non-conductive layer using silicon nitride, and wherein forming a pillar transistor over the semiconductor material includes anisotropic etching.

7. A process of fabricating a memory cell, according to claim 1, further including fabricating additional memory cells, using the process of claim 1, wherein each fabricated memory cell includes a capacitor and a pillar transistor, wherein adjacent pillar structures of respective memory cells are spaced along a direction parallel to the word line is greater than spacing between the same adjacent pillar structures along a direction parallel to the bit line.

8. A process of fabricating a memory cell, according to claim 5, wherein forming a pillar transistor over the capacitor includes forming a uniformly-doped channel section using amorphous silicon material, forming the non-conductive layer includes forming the non-conductive layer using silicon nitride, forming a conductive layer around the pillar structure includes using a spacer etching technique, and removing the dielectric material includes chemical-mechanical polishing.

9. A process of fabricating a DRAM cell, comprising:
   forming a capacitor over a first semiconductor material;
   forming a second semiconductor material over the capacitor;
   forming a non-conductive layer over the second semiconductor material;
   forming a pillar structure over the capacitor;
   forming a conductive layer around the pillar structure and therein forming part of a pillar transistor;
   forming a dielectric material over the pillar transistor;
   removing the dielectric material until the non-conductive layer is exposed;
   removing the non-conductive layer; and
   forming a conductive layer on the pillar structure.

10. A process of fabricating a DRAM cell, according to claim 9, wherein forming a semiconductor material over the capacitor includes forming the semiconductor material using amorphous silicon.

11. A process of fabricating a DRAM cell, according to claim 9, wherein forming the non-conductive layer includes forming the non-conductive layer using silicon nitride.

12. A process of fabricating a DRAM cell, according to claim 9, wherein forming a conductive layer around the pillar structure includes using a spacer etching technique.

13. A process of fabricating a DRAM cell, according to claim 9, wherein removing the dielectric material includes chemical-mechanical polishing.

14. A process of fabricating a DRAM cell, comprising:
   forming a capacitor over a semiconductor material;
   forming an amorphous silicon material over the capacitor;
   forming a non-conductive SiN-based layer over the semiconductor material;
   forming a pillar structure, including the amorphous silicon material and the non-conductive SiN-based layer, over the capacitor via an etching process;
   forming a conductive layer around the pillar structure to form a pillar transistor including the conductive layer and the pillar structure;
   forming a dielectric material over the pillar transistor;
   removing the dielectric material, via CMP, until the non-conductive SiN-based layer is exposed;
   removing the non-conductive (SiN) layer and forming a conductive layer on the pillar structure.

15. A process of fabricating a DRAM cell, according to claim 14, wherein forming the non-conductive layer includes forming the non-conductive layer using silicon nitride.

16. A process of fabricating a DRAM cell, according to claim 15, wherein forming a conductive layer around the pillar structure includes using a spacer etching technique.

17. A process of fabricating a DRAM cell, according to claim 1, wherein the capacitive layer is formed over the pillar transistor.

18. A process of fabricating a DRAM cell, according to claim 14, wherein forming a conductive layer around the pillar structure includes using a spacer etching technique.

19. A process of fabricating a DRAM cell, according to claim 1, wherein the capacitive layer is formed under the pillar transistor.

20. A process of fabricating a DRAM cell, comprising:
   forming a conductive layer;
   forming a pillar structure, including a semiconductor material, over the conductive layer and including a nonconductive SiN-based layer over the semiconductor material;
   forming a word line around the pillar and therein forming a pillar transistor;
   forming a dielectric material over the pillar transistor;
   removing the dielectric material until non-conductive SiN-based layer is exposed;
   removing the non-conductive SiN-based layer;
   forming another conductive layer on the pillar transistor;
   forming a capacitor over the pillar transistor.

21. A process of fabricating a memory device, comprising:
   forming a capacitor over a semiconductor material;
   forming an amorphous silicon material over the capacitor;
   forming a non-conductive SiN-based layer over the amorphous silicon material;
   forming a pillar structure, including the amorphous silicon material and the non-conductive SiN-based layer, over the capacitor;
   conducting a recrystallization annealing of the pillar structure;
   forming a first dielectric material around the pillar structure;
   forming a conductive layer around the pillar structure via a spacer etching process;
   forming a second dielectric material over the pillar transistor;

removing the second dielectric material, via CMP, until the non-conductive SiN-based layer is exposed; and removing the non-conductive (SiN) layer and forming a conductive layer on the pillar structure.

22. A process of fabricating a memory device, comprising:

forming a conductive layer;

forming an amorphous silicon material over the conductive layer;

forming a non-conductive SiN-based layer over the amorphous silicon material;

forming a pillar structure, including the amorphous silicon material and the non-conductive SiN-based layer;

conducting a recrystallization annealing of the pillar structure;

forming a dielectric material around the pillar structure;

forming a conductive layer around the pillar structure via a spacer etching process;

forming a dielectric material over the pillar transistor;

removing the dielectric material, via CMP, until the non-conductive SiN-based layer is exposed;

removing the non-conductive (SiN) layer and forming a conductive layer on the pillar structure;

forming a capacitor over the pillar structure.

23. A process of fabricating a transistor, comprising:

forming an amorphous silicon material over a non-conducting amorphous material;

forming a non-conductive SiN-based layer over the amorphous silicon material;

forming a pillar structure, including the amorphous silicon material and the non-conductive SiN-based layer;

conducting a recrystallization annealing of the pillar structure;

forming a dielectric material around the pillar structure;

forming a conductive layer around the pillar structure via a spacer etching process;

forming a dielectric material over the pillar transistor;

removing the dielectric material, via CMP, until the non-conductive SiN-based layer is exposed;

removing the non-conductive (SiN) layer and forming a conductive layer on the pillar structure.

* * * * *